(12) United States Patent
Chiang

(10) Patent No.: US 8,697,538 B1
(45) Date of Patent: Apr. 15, 2014

(54) METHOD OF FORMING PATTERN IN SUBSTRATE

(71) Applicant: Winbond Electronics Corp., Taichung (TW)

(72) Inventor: Lu-Ping Chiang, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 13/670,477

(22) Filed: Nov. 7, 2012

(51) Int. Cl.
*H01L 21/76* (2006.01)
*H01L 21/44* (2006.01)
*H01L 21/311* (2006.01)
*H01L 21/033* (2006.01)
*H01L 23/528* (2006.01)
*H01L 29/06* (2006.01)

(52) U.S. Cl.
CPC .......... *H01L 21/0338* (2013.01); *H01L 23/528* (2013.01); *H01L 29/06* (2013.01)
USPC ........... 438/430; 438/611; 438/696; 438/700; 438/424; 438/675; 257/E21.246

(58) Field of Classification Search
CPC .... H01L 21/0338; H01L 23/528; H01L 29/06
USPC ......... 438/424, 429, 430, 612, 669, 672, 675, 438/694, 696, 700, 736
See application file for complete search history.

(56) References Cited

U.S. PATENT DOCUMENTS

| | | | |
|---|---|---|---|
| 7,856,613 B1 | 12/2010 | Weling et al. | |
| 8,338,959 B2 * | 12/2012 | Niroomand et al. | 257/774 |
| 8,450,829 B2 * | 5/2013 | Fischer et al. | 257/499 |
| 2012/0181705 A1 * | 7/2012 | Tang et al. | 257/774 |
| 2012/0252185 A1 * | 10/2012 | Lee et al. | 438/424 |
| 2013/0012023 A1 * | 1/2013 | Park et al. | 438/689 |

* cited by examiner

*Primary Examiner* — Thanh V Pham
(74) *Attorney, Agent, or Firm* — Jianq Chyun IP Office

(57) ABSTRACT

A method of forming a pattern in a substrate is provided, in which the substrate having a pattern region is provided first. A plurality of stripe-shaped mask layers is formed on the substrate in the pattern region. Each of at least two adjacent stripe-shaped mask layers among the stripe-shaped mask layers has a protrusion portion and the protrusion portions face to each other. A spacer is formed on sidewalls of the stripe-shaped mask layers, wherein a thickness of the spacer is greater than a half of a distance between two of the protrusion portions. Subsequently, the stripe-shaped mask layers are removed. An etching process is performed by using the spacer as a mask to form trenches in the substrate. Thereafter, the trenches are filled with a material.

8 Claims, 6 Drawing Sheets

METHOD OF FORMING PATTERN IN SUBSTRATE

BACKGROUND OF THE INVENTION

1. Field of the Invention

The invention relates to a semiconductor manufacturing process. More particularly, the invention relates to a method for forming a pattern in a substrate.

2. Description of Related Art

In general, a method for forming a pattern in a substrate includes forming a patterned mask layer on the substrate first. Thereafter, by using the patterned mask layer as a mask, an etching process is performed to form trenches in the substrate. Then, a material of the predetermined pattern is filled in the trenches.

With the tendency of device miniaturization and device integration, the sizes of the line width and the space of the devices are reduced. It is difficult to form the pattern having required line width and space by using the above method. Accordingly, a double patterning method is developed.

FIGS. 1A-1E are cross-sectional views showing a double patterning method in the related art. First, referring to FIG. 1A, a patterned photoresist layer 12 is formed on a substrate 10. The patterned photoresist layer 12 has a pattern which has a ratio of the line width to the space of 1:3. Then, referring to FIG. 1B, a spacer 14 is formed on the sidewall of the patterned photoresist layer 12. A thickness of the spacer 14 is equivalent to a line width of the patterned photoresist layer 12. Subsequently, referring to FIG. 1C, the patterned photoresist layer 12 is removed. Thereafter, referring to FIG. 1D, using the spacer 14 as a mask, an etching process is carried out to form trenches 16 in the substrate 10. After that, referring to FIG. 1E, a conductive material 18 is filled in the trenches 16. As such, a conductive pattern having a ratio of the line width to the space of 1:1 is formed in the substrate 10 (a top view thereof is shown in FIG. 2).

In the method, the patterned photoresist layer 12 has the pattern with a ratio of the line width to the space of 1:3 so that the patterned photoresist layer 12 can be easily formed if the device size is smaller and smaller and the conductive pattern having the ratio of the line width to the space of 1:1 is further liable to be formed.

In some specific requirements, the conductive pattern needs be modified. For example, one of the conductive layers in the conductive pattern may require to be cutted. In specific, for cutting one conductive layer depicted in FIG. 2 at where the rectangle 20 is, a mask layer 22 as depicted in FIG. 1B needs be formed at the location corresponding to the rectangle 20 before performing the etching process depicted in FIG. 1C such that the portion of the substrate 10 at the rectangle 20 is prevented from being formed with a trench 16. Accordingly, the conductive pattern with the cut pattern is formed after the conductive material 18 is filled in the trenches 16.

However, the fabrication of the mask layer 22 requires the use of an additional mask, which increases the fabrication cost. In addition, for achieving a smaller and smaller line width, the fabrication of the mask layer is quite difficult.

SUMMARY OF THE INVENTION

The present invention provides a method for forming a pattern in a substrate, which efficiently reduces the fabrication cost and the fabrication steps.

A method of forming a pattern in a substrate is provided, in which the substrate having a pattern region is provided first. A plurality of stripe-shaped mask layers is formed on the substrate in the pattern region. Each of at least two adjacent stripe-shaped mask layers among the stripe-shaped mask layers has a protrusion portion and the protrusion portions face to each other. A spacer is formed on sidewalls of the stripe-shaped mask layers, wherein a thickness of the spacer is greater than a half of a distance between two of the protrusion portions. Subsequently, the stripe-shaped mask layers are removed. An etching process is performed by using the spacer as a mask to form trenches in the substrate. The trenches are then filled with a material.

According to the method for forming the pattern in the substrate described in an embodiment of the present invention, a material of the stripe-shaped mask layers includes a photoresist or carbon.

According to the method for forming the pattern in the substrate described in an embodiment of the present invention, an etching rate of the spacer is smaller than an etching rate of the substrate during the etching process.

According to the method for forming the pattern in the substrate described in an embodiment of the present invention, the material can be a conductive material and the substrate is, for example, a dielectric substrate.

According to the method for forming the pattern in the substrate described in an embodiment of the present invention, the material can be a dielectric material and a conductive material formed on the dielectric material and the substrate is, for example, a silicon substrate.

According to the method for forming the pattern in the substrate described in an embodiment of the present invention, a block-shaped mask layer is further formed outside the pattern region after forming the spacer and before removing the stripe-shaped mask layers, wherein the block-shaped mask layer is adjacent to terminals of the stripe-shaped mask layers and covers a portion of the spacer at the terminals of the stripe-shaped mask layers.

In light of the foregoing, according to the invention, the stripe-shaped mask layers are firstly formed on the substrate and at least two adjacent stripe-shaped mask layers respectively have a protrusion portion. Thereafter, a spacer is formed on the sidewalls of the stripe-shaped mask layers and the thickness of the spacer is greater than a half of a distance between two of the protrusion portions. Accordingly, a portion of the substrate located between the two protrusion portions is covered by the spacer and is not exposed. After performing the etching process, the portion of the substrate between the two protrusion portions is not formed with the trench. Therefore, the pattern subsequently formed in the substrate can have the required cut pattern at the region between the two protrusion portions, in which no additional mask is needed to define the mask layer for protecting the portion of the substrate between the two protrusion portions.

In order to make the aforementioned and other features and advantages of the invention more comprehensible, embodiments accompanying figures are described in detail below.

DESCRIPTION OF EMBODIMENTS

FIGS. 3A through 3D are schematic top views showing the method for forming a pattern in a substrate according to one embodiment of the invention. FIGS. 4A through 4D are cross-sectional views along a line I-I' respectively in FIGS. 3A through 3D. FIGS. 5A through 5D are cross-sectional views along a line II-II' respectively in FIGS. 3A through 3D.

Figure 1A:
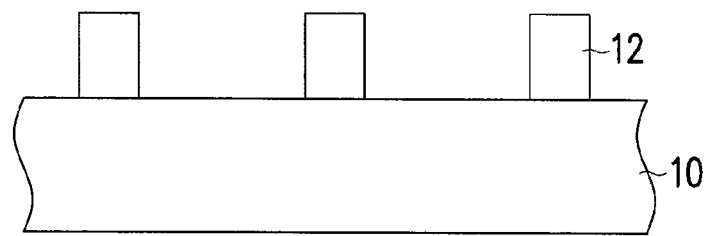
FIGS. 1A-1E are cross-sectional views showing a double patterning method in the related art.
Figure 1B:
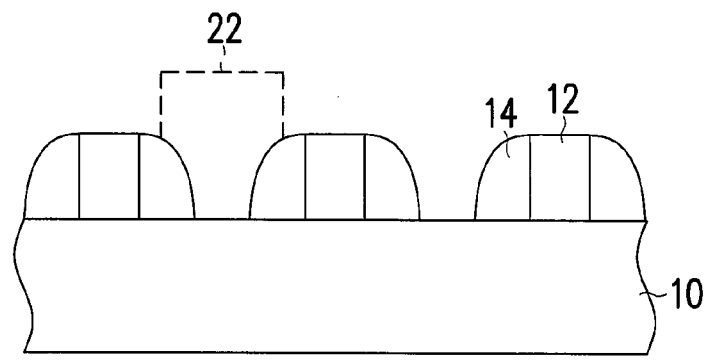
Figure 1C:
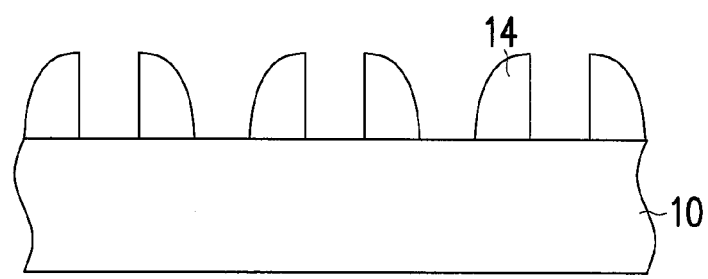
Figure 1D:
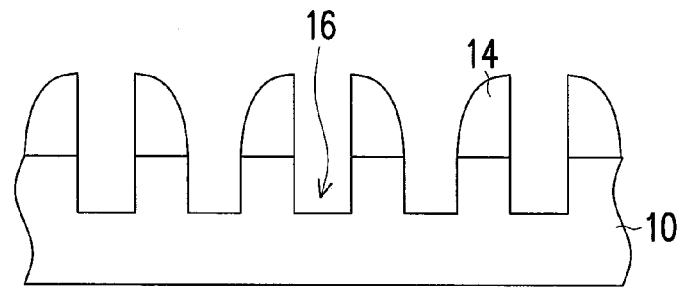
Figure 1E:
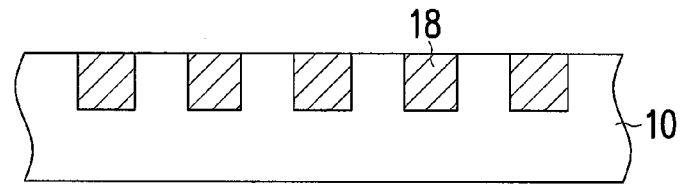
Figure 2:
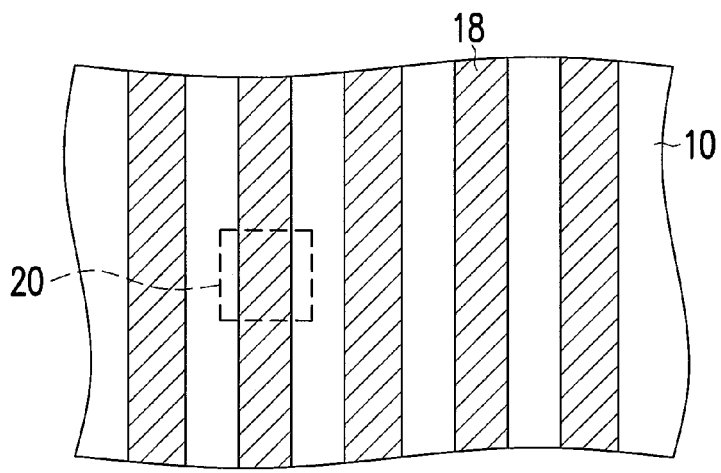
FIG. 2 is a schematic top view of FIG. 1E.
Figure 3A:
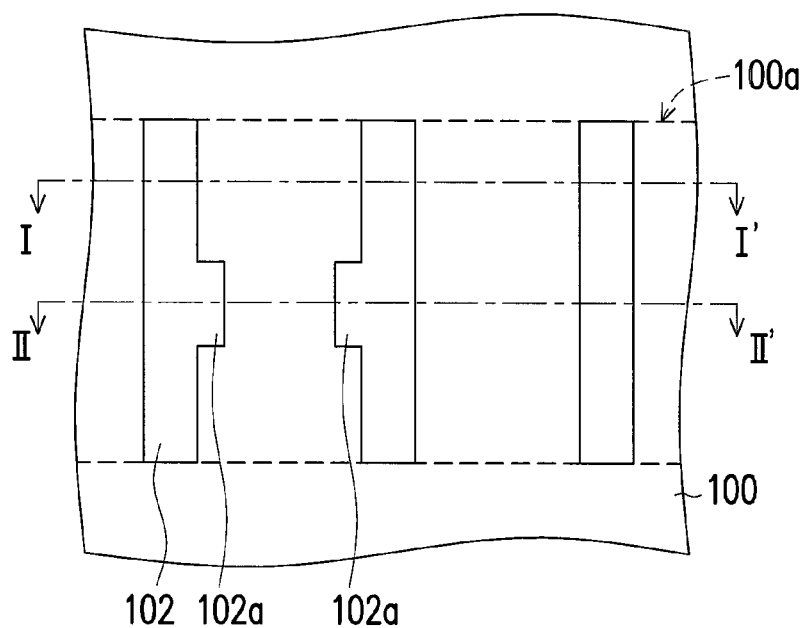
FIGS. 3A through 3D are schematic top views showing the method for forming a pattern in a substrate according to one embodiment of the invention.
Figure 4A:
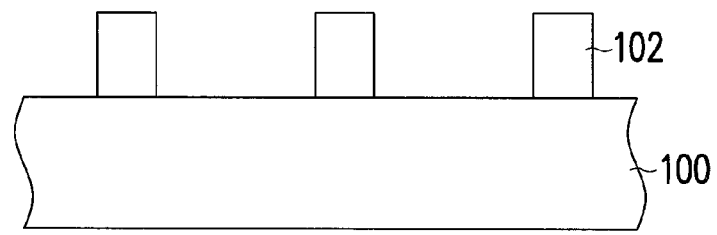
FIGS. 4A through 4D are cross-sectional views along a line I-I' respectively in FIGS. 3A through 3D.
Figure 5A:
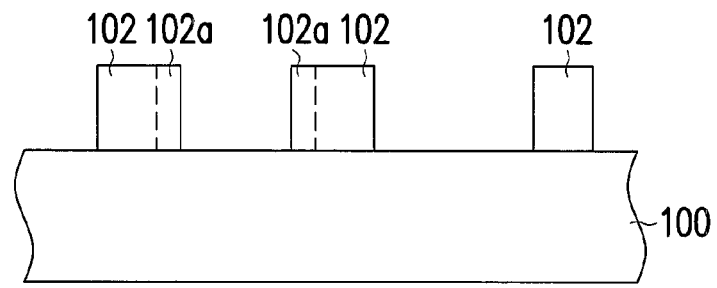
FIGS. 5A through 5D are cross-sectional views along a line II-II' respectively in FIGS. 3A through 3D.

First, referring concurrently to FIGS. 3A, 4A and 5A, a substrate 100 having a pattern region 100a is provided. According to the embodiment, the substrate 100 is exemplified as a dielectric substrate, which can be a dielectric layer formed on a semiconductor wafer or a dielectric layer in other structure. The pattern region 100a is, for example, a region for wiring layout in the substrate 100. A plurality of stripe-shaped mask layers 102 is then formed on the substrate 100 in the pattern region 100a. A material of the stripe-shaped mask layers 102 includes, for example, photoresist or carbon. In addition, each of at least two adjacent stripe-shaped mask layers 102 among the stripe-shaped mask layers 102 has a protrusion portion 102a and the two protrusion portions 102a face to each other. In the present embodiment, three stripe-shaped mask layers 102 are illustrated and the two adjacent stripe-shaped mask layers 102 at the most left side respectively have a protrusion portion 102a. However, the invention is not limited thereto and the number can be arbitrarily modified according to the actual requirement by the person who has ordinary skill in the art.

Figure 3B:
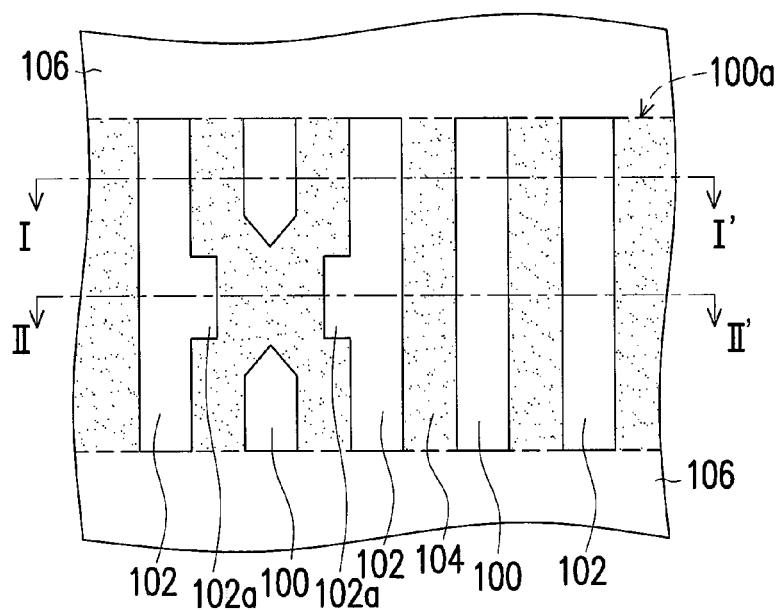
Figure 4B:
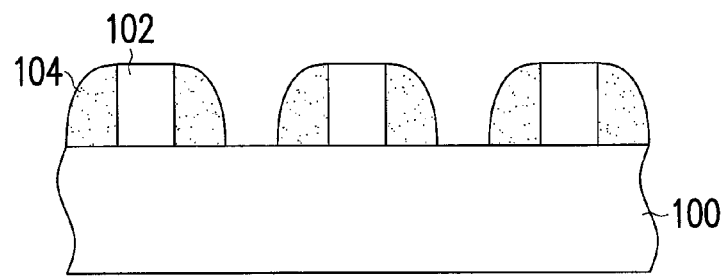
Figure 5B:
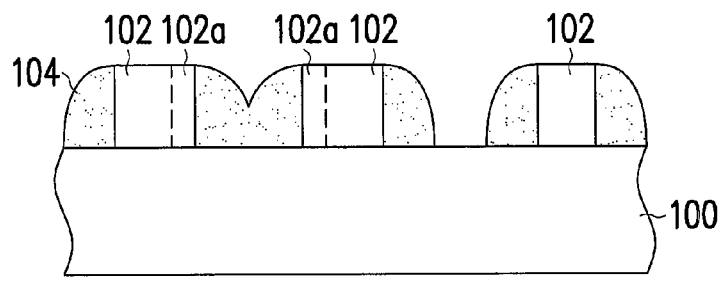

Next, referring to FIGS. 3B, 4B and 5B together, a spacer 104 is formed on sidewalls of the stripe-shaped mask layers 102. The etching rate of the spacer 104 can be smaller than the etching rate of the substrate 100 during the etching process. Therefore, the spacer 104 can be served as an etching mask during etching the substrate 100 in the subsequent etching process. A material of the spacer 104 includes oxide, for example. Furthermore, a thickness of the spacer 104 is greater than a half of a distance between the two protrusion portions 102a. Accordingly, at least the region between the two protrusion portions 102a is filled with the spacer 104, i.e. at least the portion of the substrate 100 between the two protrusion portions 102a is not exposed. Furthermore, in the present embodiment, a block-shaped mask layer 106 is formed outside the pattern region 100a after the formation of the spacer 104. The block-shaped mask layer 106 is adjacent to the terminals of the stripe-shaped mask layers 102 and covers a portion of the spacer 104 at the terminals of the stripe-shaped mask layers 102. The block-shaped mask layer 106 is formed for preventing a portion of the substrate 100 outside the pattern region 100a from being etched in the subsequent etching process.

In the foregoing steps, the region between the two protrusion portions 102a is filled with the spacer 104. Therefore, no additional mask is required to define the mask layer covering the portion of the substrate 100 between the two protrusion portions 102a, which can reduce the fabrication steps and the fabrication cost.

Figure 3C:
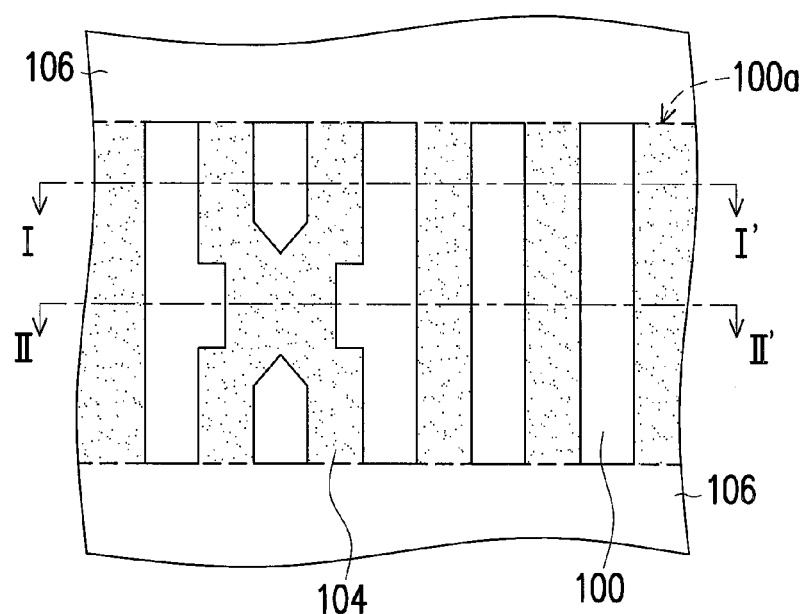
Figure 4C:
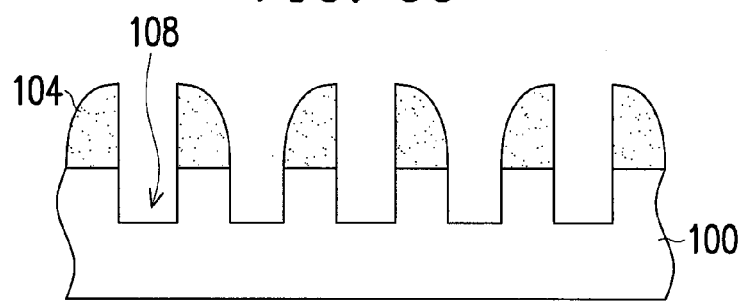
Figure 5C:
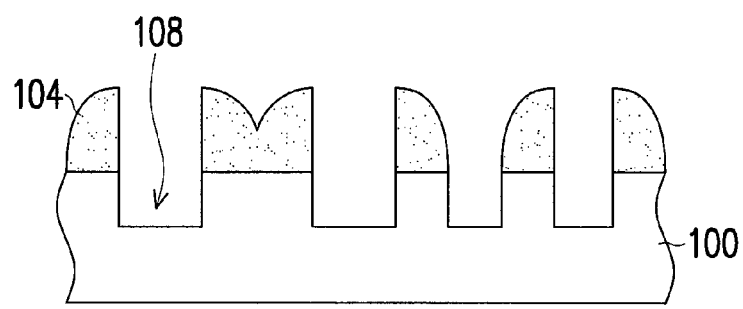

Next, refer to FIGS. 3C, 4C and 5C, the stripe-shaped mask layers 102 are removed to expose a portion of the substrate 110. Thereafter, by using the spacer 104 and the block-shaped mask layer 106 as a mask, an etching process is implemented to form trenches 108 in the substrate 100. Notably, in the present embodiment, the spacer 104 is formed between the two protrusion portions 102a such that the portion of the substrate 100 between the two protrusion portions 102a is not etched during the etching process, i.e. the trenches 108 are not formed between the two protrusion portions 102a.

Figure 3D:
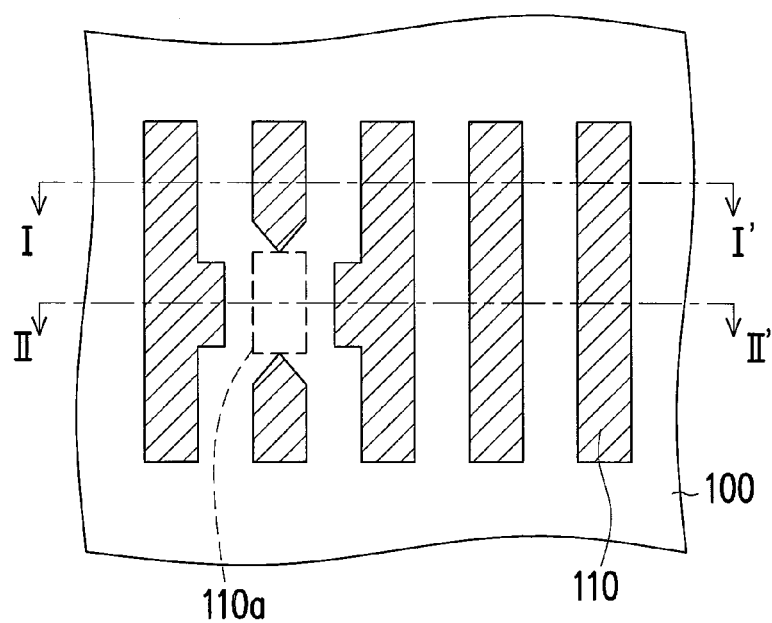
Figure 4D:
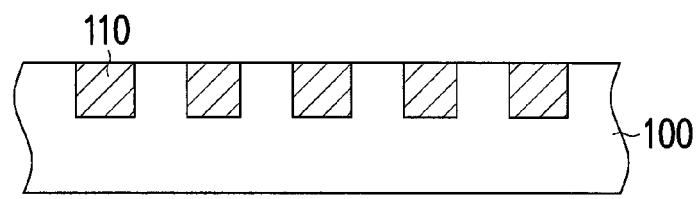
Figure 5D:
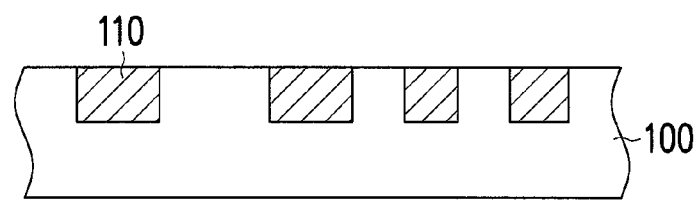

After that, referring to FIGS. 3D, 4D and 5D, a material is filled in the trenches 108. In the present embodiment, the material filled in the trenches 108 is, for example, a conductive material. Namely, the stripe-shaped conductive layers 110 capable of being served as the wiring layers are formed after the conductive material is filled in the trenches 108. The method for filling the material into the trenches 108 includes, for example, applying and coating the material on the whole substrate 100 to completely fill the trenches 108 with the material and performing a planarization process (such as the chemical-mechanical polishing process, CMP process) for removing the material outside the trenches 108. Notably, in the present embodiment, the portion of the substrate 100 between the two protrusion portions 102a does not have the trenches 108 such that the conductive layers 110 are not formed in the region between the two protrusion portions 102a after filling the trenches 108 with the conductive material. In other words, according to the present embodiment, a part of the stripe shaped conductive layers 110 can have a cut portion. As shown in FIG. 3D, the second one of the conductive layers 110 counted from the most left side has the cut portion 110a.

In the present embodiment, only two adjacent stripe-shaped mask layers have the protrusion portions respectively (i.e. the two stripe-shaped mask layers 102 at the most left side in FIGS. 3A and 3B), and thus one conductive layer having the cut portion is formed. However, the invention is not limited thereto and a person who has ordinary skill in the art can form a plurality of conductive layers with the cut portion according to the above method.

On the other hand, according to the present embodiment, the substrate 100 is exemplified as a dielectric substrate and the material filled in the trenches 108 is a conductive material, which is, however, not limited in the present invention. In an alternative embodiment, the substrate 100 can be a silicon substrate (such as a semiconductor wafer) and the material filled in the trenches 108 can be a dielectric material and a conductive material formed on the dielectric material. Namely, the trenches 108 can be formed with the gate insulation layer (dielectric material) and the gate (conductive material) of a transistor.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method for forming a pattern in a substrate, comprising:

providing the substrate having a pattern region;

forming a plurality of stripe-shaped mask layers on the substrate in the pattern region, wherein each of at least two adjacent stripe-shaped mask layers among the stripe-shaped mask layers has a protrusion portion and the protrusion portions face to each other;

forming a spacer on sidewalls of the stripe-shaped mask layers, wherein a thickness of the spacer is greater than a half of a distance between two of the protrusion portions;

removing the stripe-shaped mask layers;

performing an etching process by using the spacer as a mask to form trenches in the substrate; and filling the trenches with a material.

2. The method for forming the pattern in the substrate as claimed in claim 1, wherein a material of the stripe-shaped mask layers comprises a photoresist or carbon.

3. The method for forming the pattern in the substrate as claimed in claim 1, wherein an etching rate of the spacer is smaller than an etching rate of the substrate during the etching process.

4. The method for forming the pattern in the substrate as claimed in claim 1, wherein the material comprises a conductive material.

5. The method for forming the pattern in the substrate as claimed in claim 4, wherein the substrate comprises a dielectric substrate.

6. The method for forming the pattern in the substrate as claimed in claim 1, wherein the material comprises a dielectric material and a conductive material formed on the dielectric material.

7. The method for forming the pattern in the substrate as claimed in claim 6, wherein the substrate comprises a silicon substrate.

8. The method for forming the pattern in the substrate as claimed in claim 1, further comprising forming a block-shaped mask layer outside the pattern region after forming the spacer and before removing the stripe-shaped mask layers, wherein the block-shaped mask layer is adjacent to terminals of the stripe-shaped mask layers and covers a portion of the spacer at the terminals of the stripe-shaped mask layers.

* * * * *